(12) United States Patent
Zou et al.

(10) Patent No.: US 10,763,319 B2
(45) Date of Patent: Sep. 1, 2020

(54) DISPLAY PANEL, METHOD FOR MANUFACTURING THE SAME, DISPLAY DEVICE AND DISPLAYING METHOD

(71) Applicants: BOE TECHNOLOGY GROUP CO., LTD., Beijing (CN); HEFEI XINSHENG OPTOELECTRONICS TECHNOLOGY CO., LTD., Hefei, Anhui (CN)

(72) Inventors: Qinghua Zou, Beijing (CN); Ruhui Zhu, Beijing (CN); Gu Yao, Beijing (CN); Shupeng Guo, Beijing (CN); Litao Qu, Beijing (CN)

(73) Assignees: BOE TECHNOLOGY GROUP CO., LTD., Beijing (CN); HEFEI XINSHENG OPTOELECTRONICS TECHNOLOGY CO., LTD., Hefei, Anhui (CN)

( * ) Notice: Subject to any disclaimer, the term of this patent is extended or adjusted under 35 U.S.C. 154(b) by 58 days.

(21) Appl. No.: 16/075,001

(22) PCT Filed: Jan. 10, 2018

(86) PCT No.: PCT/CN2018/072049
§ 371 (c)(1),
(2) Date: Aug. 2, 2018

(87) PCT Pub. No.: WO2018/223699
PCT Pub. Date: Dec. 13, 2018

(65) Prior Publication Data
US 2019/0355797 A1 Nov. 21, 2019

(30) Foreign Application Priority Data
Jun. 8, 2017 (CN) .......................... 2017 1 0427338

(51) Int. Cl.
*H01L 27/32* (2006.01)
*G09G 3/3225* (2016.01)
*H01L 51/52* (2006.01)

(52) U.S. Cl.
CPC ....... *H01L 27/3258* (2013.01); *G09G 3/3225* (2013.01); *H01L 27/3248* (2013.01);
(Continued)

(58) Field of Classification Search
CPC .......................... H01L 25/167; H01L 27/1225
See application file for complete search history.

(56) References Cited

U.S. PATENT DOCUMENTS 6,911,960 B1    6/2005 Yokoyama
2007/0001205 A1*  1/2007 Kimura ................ G09G 3/3241
                                              257/296
(Continued)

FOREIGN PATENT DOCUMENTS

CN    104752461 A    7/2015
CN    104882466 A    9/2015
(Continued)

OTHER PUBLICATIONS

PCT International Search Report, Application No. PCT/CN2018/072049, dated Apr. 12, 2018, 6 pages; with English translation.
(Continued)

*Primary Examiner* — Shaheda A Abdin
(74) *Attorney, Agent, or Firm* — Armstrong Teasdale LLP

(57) ABSTRACT

Embodiments of the present disclosure relate to a display panel, a method for manufacturing the same, a display device and a displaying method. The display panel includes a substrate, a thin film transistor on the substrate, an insulating layer covering the substrate and the thin film transistor, a first electrode and a second electrode on the insulating layer and electrically insulated with each other, wherein an (Continued)

orthographic projection of the first electrode on the substrate does not overlap with an orthographic projection of the thin film transistor on the substrate, an orthographic projection of the second electrode on the substrate overlaps with an orthographic projection of the thin film transistor on the substrate, a light emitting layer on the first electrode and the second electrode, and a third electrode and a fourth electrode on the light emitting layer.

20 Claims, 7 Drawing Sheets

(52) U.S. Cl.
CPC ...... *H01L 27/3262* (2013.01); *H01L 51/5231* (2013.01); *G09G 2300/0809* (2013.01); *H01L 2227/32* (2013.01)

(56) References Cited

U.S. PATENT DOCUMENTS

| | | | | |
|---|---|---|---|---|
| 2007/0188087 A1* | 8/2007 | Kwon | ..................... | H01L 51/52 313/506 |
| 2008/0129907 A1* | 6/2008 | Jun | ..................... | G09G 3/3648 349/38 |
| 2014/0061619 A1* | 3/2014 | Zhu | ..................... | H01L 51/5256 257/40 |
| 2014/0183471 A1* | 7/2014 | Heo | ..................... | H01L 27/322 257/40 |
| 2015/0001527 A1 | 1/2015 | Tsang | | |
| 2017/0025488 A1* | 1/2017 | Li | ..................... | H01L 29/78645 |
| 2017/0032744 A1* | 2/2017 | Yoo | ..................... | G09G 3/3406 |
| 2017/0141346 A1* | 5/2017 | Yao | ..................... | H01L 27/3279 |

FOREIGN PATENT DOCUMENTS

| | | |
|---|---|---|
| CN | 105789265 A | 7/2016 |
| CN | 106057821 A | 10/2016 |
| CN | 106469748 A | 3/2017 |
| CN | 107195662 A | 9/2017 |

OTHER PUBLICATIONS

PCT Written Opinion, Application No. PCT/CN2018/072049, dated Apr. 12, 2018, 6 pages.: with English translation of relevant part.
China First Office Action, Application No. 201710427338.9, dated Jun. 14, 2019, 17 pps.: with English translation.

\* cited by examiner

DISPLAY PANEL, METHOD FOR MANUFACTURING THE SAME, DISPLAY DEVICE AND DISPLAYING METHOD

CROSS REFERENCE TO RELATED APPLICATIONS

This patent application is a National Stage Entry of PCT/CN2018/072049 filed on Jan. 10, 2018, which claims the benefit and priority of Chinese Patent Application No. 201710427338.9 filed on Jun. 8, 2017, the disclosures of which are incorporated herein by reference in their entirety as part of the present application.

BACKGROUND

Embodiments of the present disclosure relate to the field of display technologies, and in particular, to a display panel, a method for manufacturing the same, a display device and a displaying method.

Organic Light Emitting Diode (OLED) and Quantum dot Light Emitting Diode (QLED) display devices have superior characteristics in aspects of self-luminous, no backlight, high contrast, thin thickness, wide viewing angle, fast reaction speed, being applicable for flexible panels, and wide range of using temperature. Due to the superior characteristics above, the OLED and QLED are recognized as the mainstream technology for next-generation displays and have been favored by major display manufacturers.

BRIEF DESCRIPTION

Embodiments of the present disclosure provide a display panel, a method for manufacturing the same, a display device and a displaying method.

A first aspect of the present disclosure provides a display panel. The display panel includes a substrate, a thin film transistor on the substrate, an insulating layer covering the substrate and the thin film transistor, a first electrode and a second electrode on the insulating layer and electrically insulated with each other, wherein an orthographic projection of the first electrode on the substrate does not overlap with an orthographic projection of the thin film transistor on the substrate, an orthographic projection of the second electrode on the substrate overlaps with an orthographic projection of the thin film transistor on the substrate, a light emitting layer on the first electrode and the second electrode, and a third electrode and a fourth electrode on the light emitting layer, wherein an orthographic projection of the third electrode on the substrate overlaps with an orthographic projection of the first electrode on the substrate, an orthographic projection of the fourth electrode on the substrate overlaps with an orthographic projection of the second electrode on the substrate. The first electrode, the third electrode, and a first portion of the light emitting layer between the first electrode and the third electrode constitute a first pixel, the second electrode, the fourth electrode and a second portion of the light emitting layer between the second electrode and the fourth electrode constitute a second pixel.

In an embodiment of the present disclosure, the first electrode is connected to a source/drain electrode of the thin film transistor through a via penetrating the insulating layer, thereby the first pixel is used as a display pixel and the second pixel is used as an illumination pixel.

In an embodiment of the present disclosure, the second electrode is connected to a source/drain electrode of the thin film transistor through a via penetrating the insulating layer, thereby the first pixel is used as an illumination pixel and the second pixel is used as a display pixel.

In an embodiment of the present disclosure, the first electrode, the third electrode, and the fourth electrode are transparent electrodes, and the second electrode is a non-transparent electrode.

In an embodiment of the present disclosure, the transparent electrode includes a transparent conductive material and the non-transparent electrode includes a metal.

In an embodiment of the present disclosure, the third electrode and the fourth electrode are formed integrally.

In an embodiment of the present disclosure, the display panel further includes a pixel definition layer between the first electrode and the second electrode.

A second aspect of the present disclosure provides a method for manufacturing a display panel. The method includes forming a thin film transistor on a substrate, forming a thin film transistor on a substrate, forming an insulating layer to cover the substrate and the thin film transistor, forming a first electrode and a second electrode electrically insulated with each other on the insulating layer, wherein an orthographic projection of the first electrode on the substrate does not overlap with an orthographic projection of the thin film transistor on the substrate, an orthographic projection of the second electrode on the substrate overlaps with an orthographic projection of the thin film transistor on the substrate, forming a light emitting layer on the first electrode and the second electrode, and forming a third electrode and a fourth electrode on the light emitting layer, wherein an orthographic projection of the third electrode on the substrate overlaps with an orthographic projection of the first electrode on the substrate, an orthographic projection of the fourth electrode on the substrate overlaps with an orthographic projection of the second electrode on the substrate. The first electrode, the third electrode, and a first portion of the light emitting layer between the first electrode and the third electrode constitute a first pixel, the second electrode, the fourth electrode and a second portion of the light emitting layer between the second electrode and the fourth electrode constitute a second pixel.

In an embodiment of the present disclosure, forming the insulating layer further includes patterning the insulating layer to form a via penetrating the insulating layer.

In an embodiment of the present disclosure, the first electrode is connected to a source/drain electrode of the thin film transistor through the via, thereby the first pixel is used as a display pixel and the second pixel is used as an illumination pixel.

In an embodiment of the present disclosure, the second electrode is connected to a source/drain electrode of the thin film transistor through the via, thereby the first pixel is used as an illumination pixel and the second pixel is used as a display pixel.

In an embodiment of the present disclosure, the first electrode, the third electrode and the fourth electrode are transparent electrodes, and the second electrode is a non-transparent electrode.

In an embodiment of the present disclosure, the transparent electrode includes a transparent conductive material and the non-transparent electrode includes a metal.

In an embodiment of the present disclosure, the third electrode and the fourth electrode are formed integrally.

In an embodiment of the present disclosure, the method further includes forming a pixel definition layer between the first electrode and the second electrode prior to forming the light emitting layer.

A third aspect of the present disclosure provides a display device including the display panel described in the first aspect of the present disclosure.

A fourth aspect of the present disclosure provides a displaying method using the display panel described in the first aspect of the present disclosure. The method controls the display panel using one of the following modes: a first mode, wherein the first pixel is a display pixel, the second pixel is an illumination pixel, the first pixel emits light, and the second pixel does not emit light, a second mode, wherein the first pixel is a display pixel, the second pixel is an illumination pixel, and the first pixel and the second pixel simultaneously emit light, a third mode, wherein the first pixel is a display pixel, the second pixel is an illumination pixel, the first pixel does not emit light, and the second pixel emits light, a fourth mode, wherein the first pixel is an illumination pixel, the second pixel is a display pixel, the first pixel does not emit light, and the second pixel emits light, and a fifth mode, wherein the first pixel is an illumination pixel, the second pixel is a display pixel, the first pixel emits light, and the second pixel does not emit light.

Further aspects and regions of applicability will become apparent from the description provided herein. It should be understood that various aspects of this disclosure may be implemented individually or in combination with one or more other aspects. It should also be understood that the description and specific examples herein are intended for purposes of illustration only and are not intended to limit the scope of the present disclosure.

BRIEF DESCRIPTION OF THE DRAWINGS

The drawings described herein are for illustrative purposes only of selected embodiments and not all possible implementations, and are not intended to limit the scope of the present disclosure.

Corresponding reference numerals indicate corresponding parts or features throughout the several views of the drawings.

DETAILED DESCRIPTION

Figure 1:
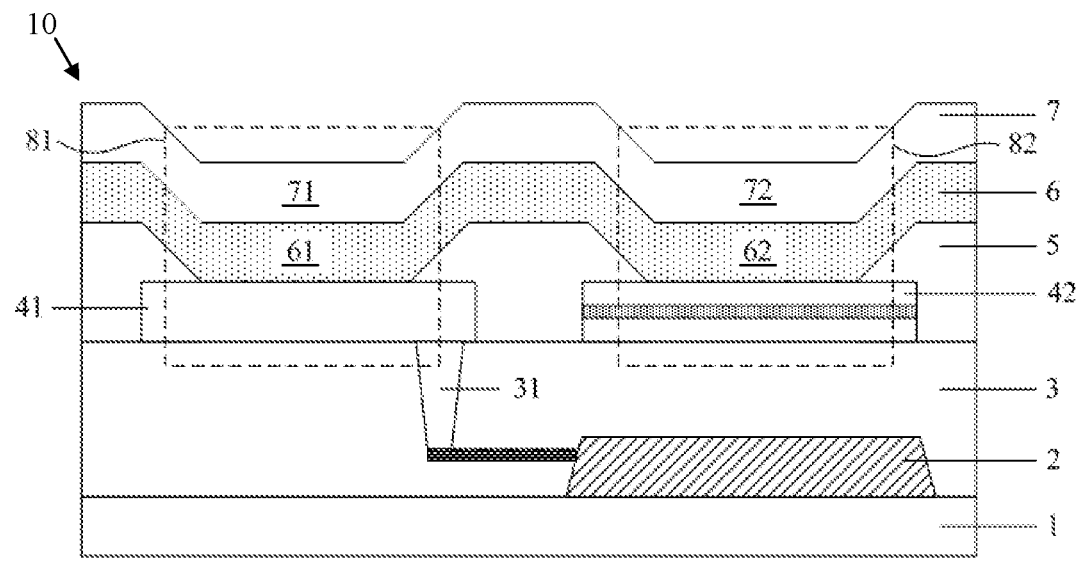
FIG. 1 is a schematic view of a cross section of a display panel in accordance with an embodiment of the present disclosure.

As used herein and in the appended claims, the singular form of a word includes the plural, and vice versa, unless the context clearly dictates otherwise. Thus, the references "a", "an", and "the" are generally inclusive of the plurals of the respective terms. Similarly, the words "comprise", "comprises", and "comprising" are to be interpreted inclusively rather than exclusively. Likewise, the terms "include", "including" and "or" should all be construed to be inclusive, unless such a construction is clearly prohibited from the context. Where used herein the term "examples," particularly when followed by a listing of terms is merely exemplary and illustrative, and should not be deemed to be exclusive or comprehensive.

In addition, it should be noted that, in the description of the present disclosure, the orientations or positions relationship indicated by the terms "upper", "above", "lower", "under", "top", "bottom", "between", etc. are the orientations or positions relationship based on the orientations or positions relationship shown in the drawings, which is merely for the convenience of describing the present disclosure and simplifying the description, and does not indicate or imply that the referred device or element has to have a specific orientation and is constructed and operated in a specific orientation, therefore, it cannot be understood as a limitation to the disclosure. In addition, when an element or a layer is referred to as being "on" another element or layer, the element or the layer can be directly on the another element or layer, or an intermediate element or layer can be present, likewise, when an element or a layer is referred to as being "under" another element or layer, the element or the layer can be directly under another element or layer, or at least one intermediate element or layer can be present, when an element or a layer is referred to as being between two elements or two layers, the element or the layer can be an unique element or layer between the two elements or the two layers, or more than one intermediate element or layer can be present.

Further to be noted, when the elements and the embodiments thereof of the present application are introduced, the articles "a/an", "one", "the" and "said" are intended to represent the existence of one or more elements. Unless otherwise specified, "a plurality of" means two or more. The expressions "comprise", "include", "contain" and "have" are intended as inclusive and mean that there may be other elements besides those listed. The terms such as "first" and "second" are used herein only for purposes of description and are not intended to indicate or imply relative importance and the order of formation.

The flow diagrams depicted herein are just one example. There may be many variations to this diagram or the steps described therein without departing from the spirit of the disclosure. For instance, the steps may be performed in a differing order or steps may be added, deleted, or modified. All of these variations are considered a part of the claimed disclosure.

Example embodiments will now be described more fully with reference to the accompanying drawings.

In an embodiment of the present disclosure, a display panel is provided. The display panel can be an OLED display panel or a QLED display panel. An anode is disposed between a thin film transistor and a light emitting layer of the display panel to utilize the light emitting layer corresponding to the anode, thereby increasing the aperture ratio of the display panel and enabling the display panel to perform both display and illumination functions.

FIG. 1 is a schematic view of a cross section of a display panel 10 in accordance with an embodiment of the present disclosure. As shown in FIG. 1, the display panel 10 includes a substrate 1, a thin film transistor 2 on the substrate 1, an insulating layer 3 covering the substrate 1 and the thin film transistor 2, wherein the insulating layer 3 includes a via 31 penetrating the insulating layer 3, a first electrode 41 and a second electrode 42 on the insulating layer 3 and electrically insulated with each other, wherein an orthographic projection of the first electrode 41 on the substrate 1 does not overlap with an orthographic projection of the thin film transistor 2 on the substrate 1, an orthographic projection of the second electrode 42 on the substrate 1 overlaps with an orthographic projection of the thin film transistor 2 on the substrate 1, a pixel definition layer 5 between the first electrode 41 and the second electrode 42, a light emitting layer 6 on the first electrode 41, the second electrode 42 and the pixel definition layer 5, and an electrode layer 7 on the light emitting layer 6. The electrode layer 7 includes a third electrode 71 and a fourth electrode 72. An orthographic projection of the third electrode 71 on the substrate 1 overlaps with an orthographic projection of the first electrode 41 on the substrate 1, and the orthographic projection of the fourth electrode 72 on the substrate 1 overlaps with an orthographic projection of the second electrode 42 on the substrate 1. According to an embodiment of the present disclosure, the third electrode 71 and the fourth electrode 72 may be formed integrally.

In an embodiment of the present disclosure, the first electrode 41, the third electrode 71, and a first portion 61 of the light emitting layer 6 between the first electrode 41 and the third electrode 71 constitute a first pixel 81, and the second electrode 42, the fourth electrode 72 and a second portion 62 of the light emitting layer 6 between the second electrode 42 and the fourth electrode 72 constitute a second pixel 82.

As shown in FIG. 1, the first electrode 41 is connected to a source/drain electrode of the thin film transistor 2 through the via 31, thereby the first pixel 81 is used as a display pixel and the second pixel 82 is used as an illumination pixel.

Figure 2:
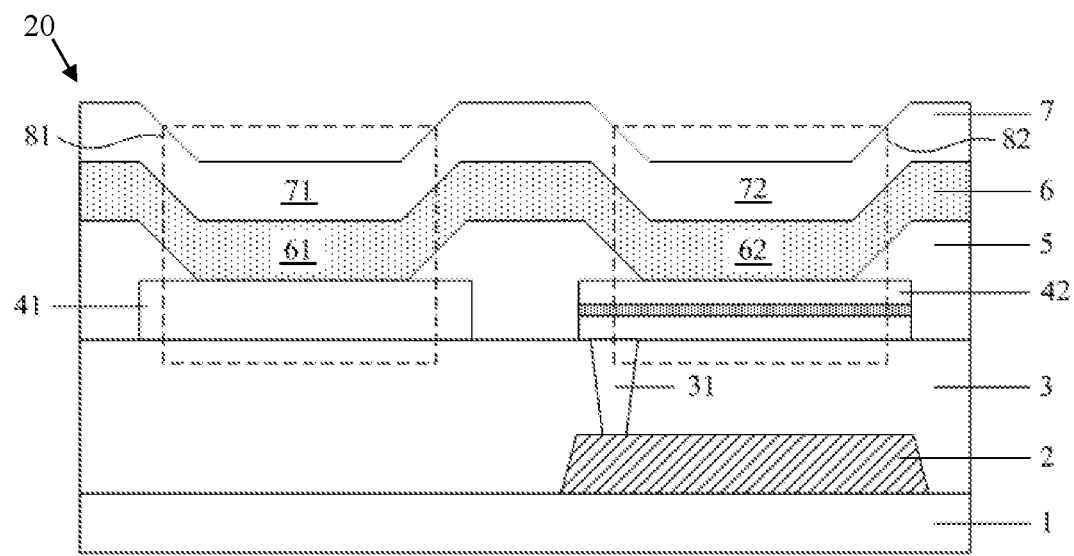
FIG. 2 is a schematic view of a cross section of a display panel in accordance with another embodiment of the present disclosure.

FIG. 2 is a schematic view of a cross section of a display panel 20 in accordance with another embodiment of the present disclosure. FIG. 2 differs from FIG. 1 in that, as shown in FIG. 2, the second electrode 42 is connected to the source/drain electrode of the thin film transistor 2 through the via 31, thereby the first pixel 81 is used as an illumination pixel and the second pixel 82 is used as a display pixel. The other parts of FIG. 2 are similar to FIG. 1 and will not be described again.

In an embodiment of the present disclosure, the first electrode 41, the third electrode 71, and the fourth electrode 72 are transparent electrodes, and the second electrode 42 is a non-transparent electrode. As an example, the transparent electrode may include a transparent conductive material, for example, a transparent conductive oxide such as indium tin oxide, indium tin zinc oxide, and tin oxide. The non-transparent electrode may include a metal such as silver or aluminum. According to an embodiment of the present disclosure, when the metal is a metal that is easily oxidized such as silver or aluminum, an anti-oxidation layer such as indium tin oxide may also be formed on the metal surface. In an embodiment of the present disclosure, the non-transparent electrode may be a stack of indium tin oxide/silver/indium tin oxide, as shown by the second electrode 42 in FIG. 1.

In an embodiment of the present disclosure, the substrate 1 is transparent. The substrate 1 may be a glass substrate.

In an embodiment of the present disclosure, the thin film transistor 2 may be a top gate thin film transistor or a bottom gate thin film transistor, which is not specifically limited herein.

In an embodiment of the present disclosure, the insulating layer 3 may be a stack including a passivation layer and a protection layer.

Figure 3:
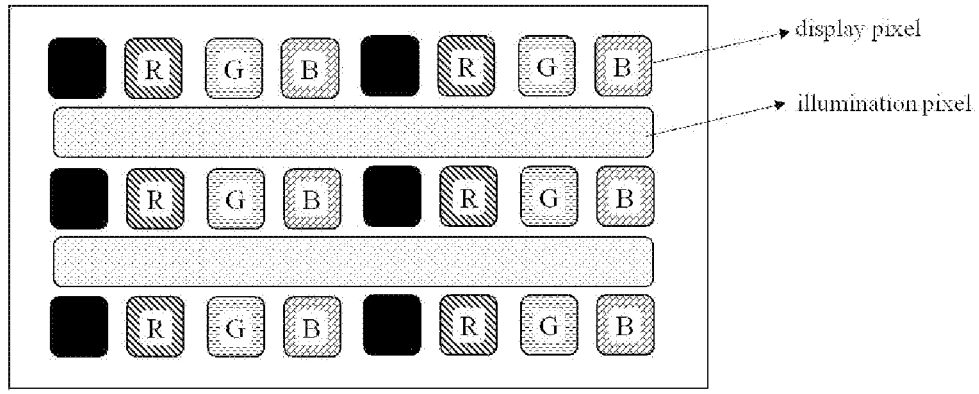
FIG. 3 is a plan view of a display panel in accordance with an embodiment of the present disclosure.

FIG. 3 is a plan view of a display panel in accordance with an embodiment of the present disclosure. As shown in FIG. 3, the pixel region of the display panel includes a display pixel and an illumination pixel. In the embodiment shown in FIG. 1, the display pixel in FIG. 3 corresponds to the first pixel 81, and the illumination pixel corresponds to the second pixel 82. In the embodiment shown in FIG. 2, the display pixel in FIG. 3 corresponds to the second pixel 82, and the illumination pixel corresponds to the first pixel 81. In addition, a black matrix may be included between display pixels to prevent crosstalk of light.

In an embodiment of the present disclosure, a method for manufacturing the above-described display panel is also provided. The manufactured display panel can realize both display and illumination functions.

Figure 4:
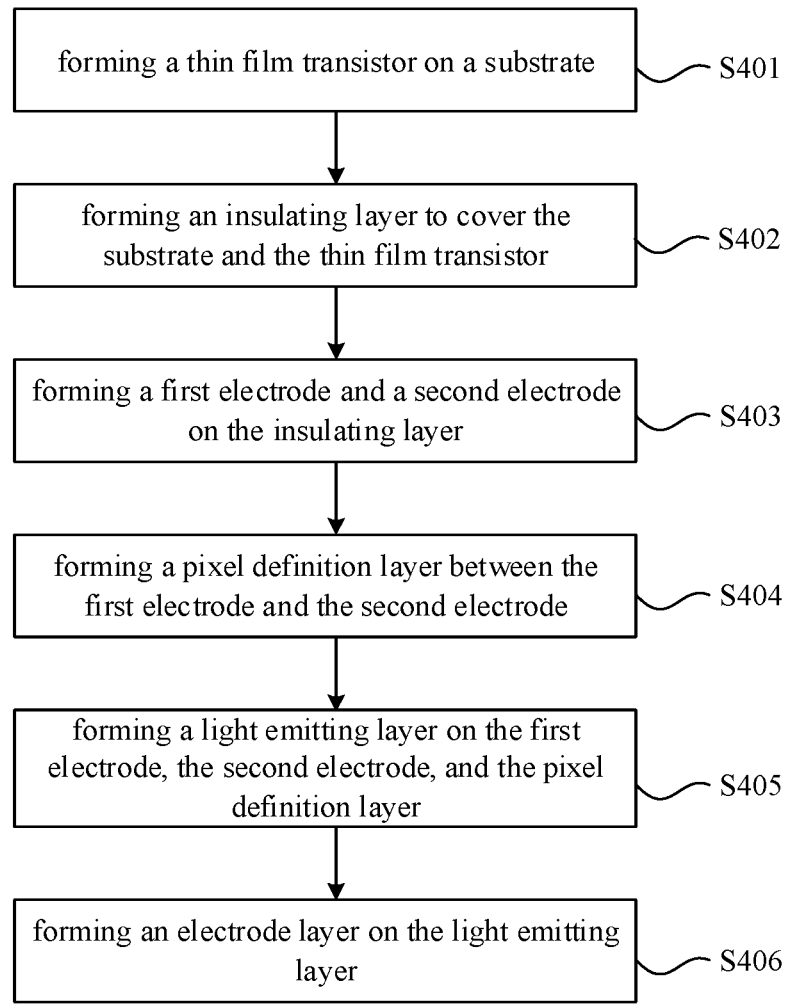
FIG. 4 is a flow chart of a method for manufacturing a display panel in accordance with an embodiment of the present disclosure.
Figure 5:
FIG. 5 is a schematic view of forming a thin film transistor of a method for manufacturing a display panel in accordance with an embodiment of the present disclosure.

FIG. 4 is a flow chart of a method for manufacturing a display panel in accordance with an embodiment of the present disclosure. As shown in FIG. 4, in step 401, a thin film transistor is formed on a substrate. FIG. 5 further shows a schematic view of forming the thin film transistor 2.

In an embodiment of the present disclosure, as shown in FIG. 5, the thin film transistor 2 is formed on the substrate 1. The substrate 1 may be a transparent substrate such as a glass substrate. In an embodiment of the present disclosure, the method of forming the thin film transistor 2 is not particularly limited, and the thin film transistor 2 can be formed using a method known to those skilled in the art. In addition, the thin film transistor 2 may be a top gate thin film transistor or a bottom gate thin film transistor.

Figure 6:
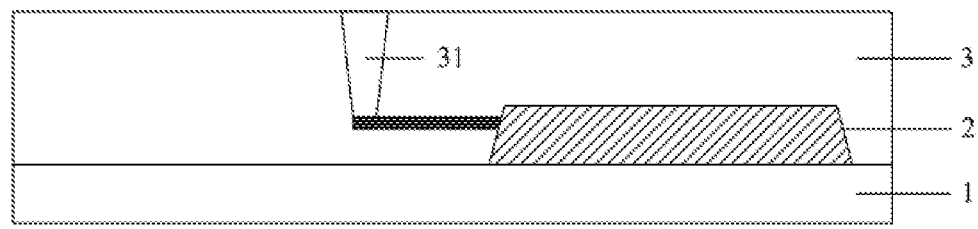
FIG. 6 is a schematic view of forming an insulating layer of a method for manufacturing a display panel in accordance with an embodiment of the present disclosure.

As shown in FIG. 4, in step S402, an insulating layer is formed to cover the substrate and the thin film transistor. FIG. 6 further shows a schematic view of forming the insulating layer 3.

In an embodiment of the present disclosure, as shown in FIG. 6, the insulating layer 3 is formed to cover the substrate 1 and the thin film transistor 2. In addition, step S402 further includes patterning the insulating layer 3 to form a via 31 penetrating the insulating layer 3 and exposing a source/drain electrode of the thin film transistor 2.

In an embodiment of the present disclosure, the insulating layer 3 may be a stack including a passivation layer and a protection layer.

Figure 7:
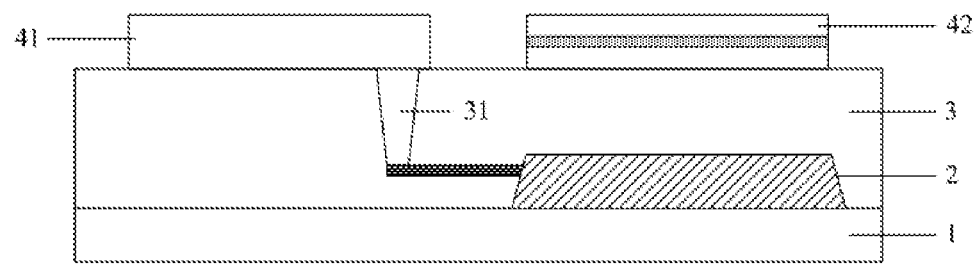
FIG. 7 is a schematic view of forming a first electrode and a second electrode of a method for manufacturing a display panel in accordance with an embodiment of the present disclosure.

As shown in FIG. 4, in step S403, a first electrode and a second electrode are formed on the insulating layer. FIG. 7 further shows a schematic view of forming the first electrode 41 and the second electrode 42.

In an embodiment of the present disclosure, as shown in FIG. 7, the patterned first electrode 41 and second electrode 42 are formed on the insulating layer 3. An orthographic projection of the first electrode 41 on the substrate 1 does not overlap with an orthographic projection of the thin film transistor 2 on the substrate 1, and an orthographic projection of the second electrode 42 on the substrate 1 overlaps with an orthographic projection of the thin film transistor 2 on the substrate 1. The first electrode 41 is a transparent electrode. The second electrode 42 is a non-transparent electrode.

Figure 8:
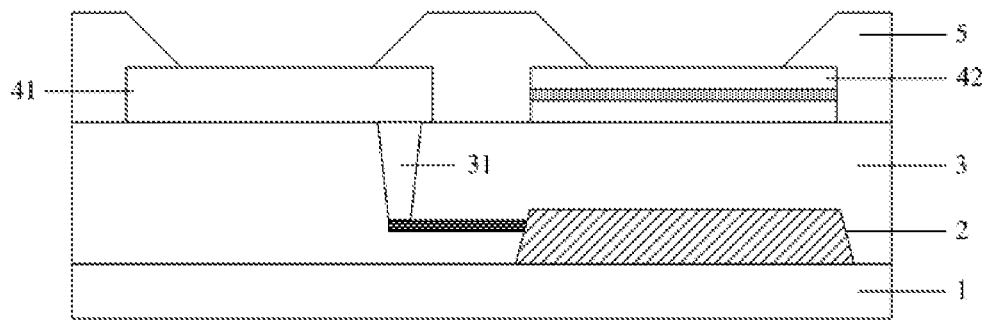
FIG. 8 is a schematic view of forming a pixel definition layer of a method for manufacturing a display panel in accordance with an embodiment of the present disclosure.

As shown in FIG. 4, in step S404, a pixel definition layer is formed between the first electrode and the second electrode. FIG. 8 further shows a schematic view of forming the pixel definition layer 5.

In an embodiment of the present disclosure, as shown in FIG. 8, the patterned pixel definition layer 5 is formed between the first electrode 41 and the second electrode 42. The pixel definition layer 5 forms a pixel opening, thereby forming a plurality of sub-pixel units.

Figure 9:
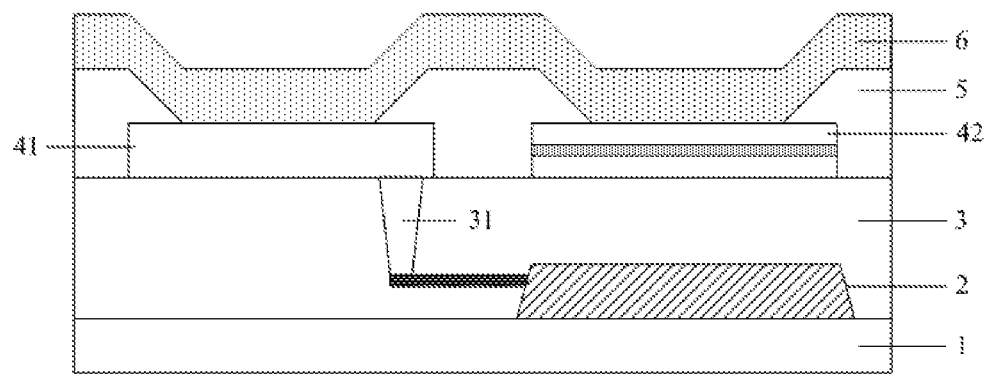
FIG. 9 is a schematic view of forming a light emitting layer of a method for manufacturing a display panel in accordance with an embodiment of the present disclosure.

As shown in FIG. 4, in step S405, a light emitting layer is formed on the first electrode, the second electrode, and the pixel definition layer. FIG. 9 further shows a schematic view of forming the light emitting layer 6.

In an embodiment of the present disclosure, as shown in FIG. 9, the light emitting layer 6 is formed to cover the first electrode 41, the second electrode 42, and the pixel definition layer 5. Here, the light emitting layer 6 may be an OLED light emitting layer or a QLED light emitting layer. Those skilled in the art can make a selection according to actual needs.

Figure 10:
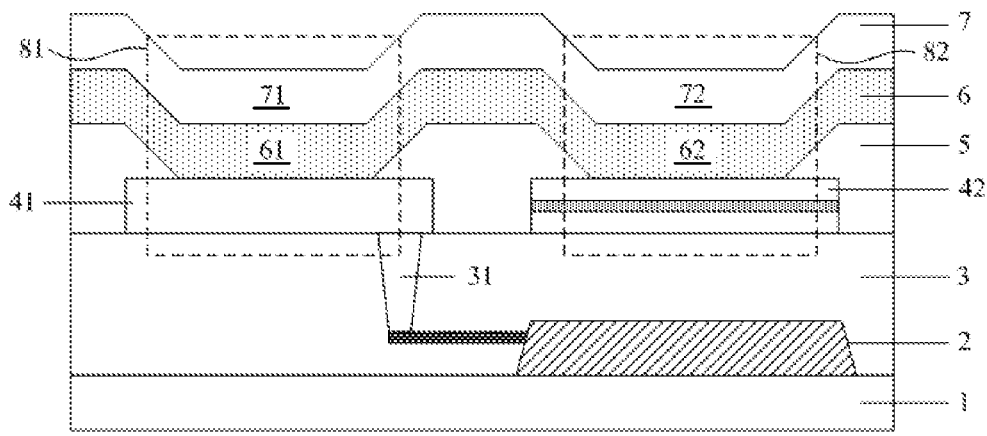
FIG. 10 is a schematic view of forming an electrode layer of a method for manufacturing a display panel in accordance with an embodiment of the present disclosure.

As shown in FIG. 4, in step S406, an electrode layer is formed on the light emitting layer. FIG. 10 further shows a schematic view of forming the electrode layer 7.

In an embodiment of the present disclosure, as shown in FIG. 10, the electrode layer 7 is formed on the light emitting layer 6. The electrode layer 7 may include a third electrode 71 and a fourth electrode 72. An orthographic projection of the third electrode 71 on the substrate 1 overlaps with an orthographic projection of the first electrode 41 on the substrate 1, and an orthographic projection of the fourth electrode 72 on the substrate 1 overlaps with an orthographic projection of the second electrode 42 on the substrate 1. The first electrode 41 and the second electrode 42 are anodes. The third electrode 71 and the fourth electrode 72 are cathodes. The first electrode 41, the third electrode 71, and a first portion 61 of the light emitting layer 6 may constitute a first pixel 81. The second electrode 42, the fourth electrode 72, and a second portion 62 of the light emitting layer 6 may constitute a second pixel 82.

In FIG. 10, the first electrode 41 is connected to the source/drain electrode of the thin film transistor 2 through the via 31, so that the first pixel 81 is used as a display pixel and the second pixel 82 is used as an illumination pixel. Further, the second electrode 42 may also be connected to the source/drain electrode of the thin film transistor 2 through the via 31, so that the first pixel 81 is used as an illumination pixel and the second pixel 82 is used as a display pixel, as shown in FIG. 2.

In an embodiment of the present disclosure, there is also provided a displaying method using the above-described display panel, which enables the display panel to perform both display and illumination functions.

Figure 11:
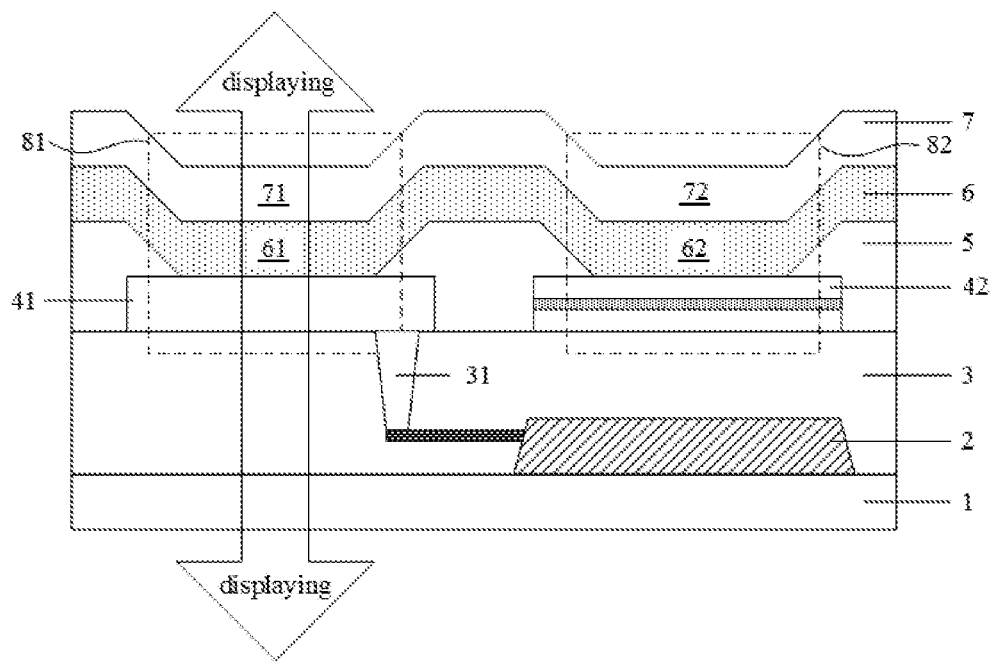
FIG. 11 is a schematic view of a first mode of a display panel in accordance with an embodiment of the present disclosure.

FIG. 11 is a schematic view of a first mode of a display panel in accordance with an embodiment of the present disclosure. As shown in FIG. 11, in the first mode, the first electrode 41 is connected to the source/drain electrode of the thin film transistor 2 through the via 31, with the first pixel 81 being used as a display pixel and the second pixel 82 being used as an illumination pixel. In the first mode, the first pixel 81 emits light, and the second pixel 82 does not emit light, thereby realizing double-side display. That is, the first mode can be referred as a double-side display mode.

Figure 12:
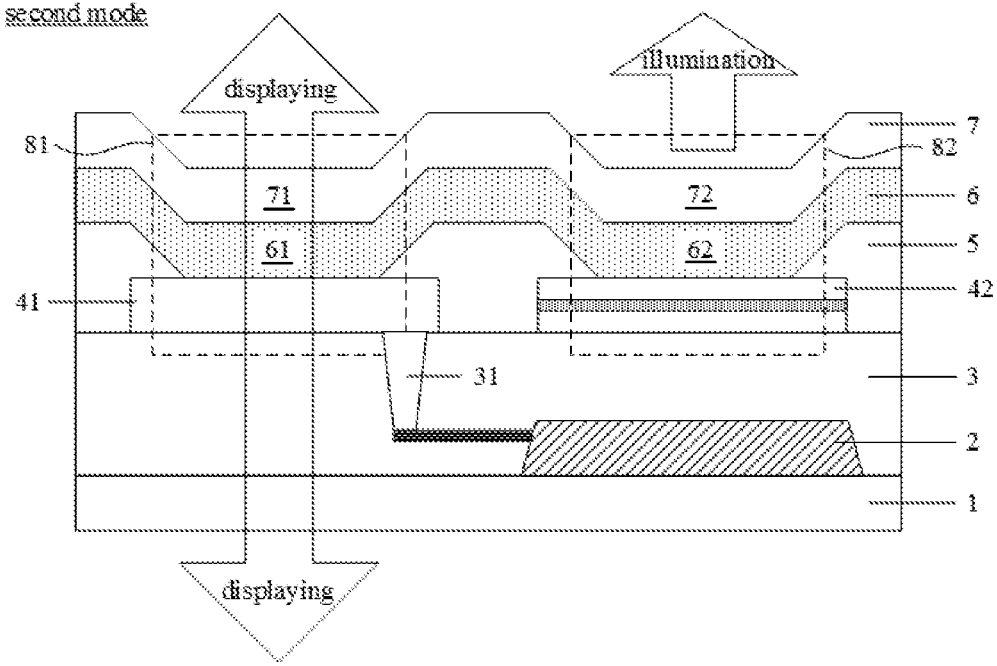
FIG. 12 is a schematic view of a second mode of a display panel in accordance with an embodiment of the present disclosure.

FIG. 12 is a schematic view of a second mode of a display panel in accordance with an embodiment of the present disclosure. As shown in FIG. 12, in the second mode, the first electrode 41 is connected to the source/drain electrode of the thin film transistor 2 through the via 31, with the first pixel 81 being used as a display pixel and the second pixel 82 being used an illumination pixel. In the second mode, the first pixel 81 and the second pixel 82 emit light simultaneously, thereby realizing both-side display and illumination. Since the second pixel 82 emits light for illumination, the brightness of the illumination affects the display effect of the display region on the same side of the illumination region to form a secret display, thereby enabling one side to display and the other side to illuminate. That is, the second mode can be referred as a secret display mode.

Figure 13:
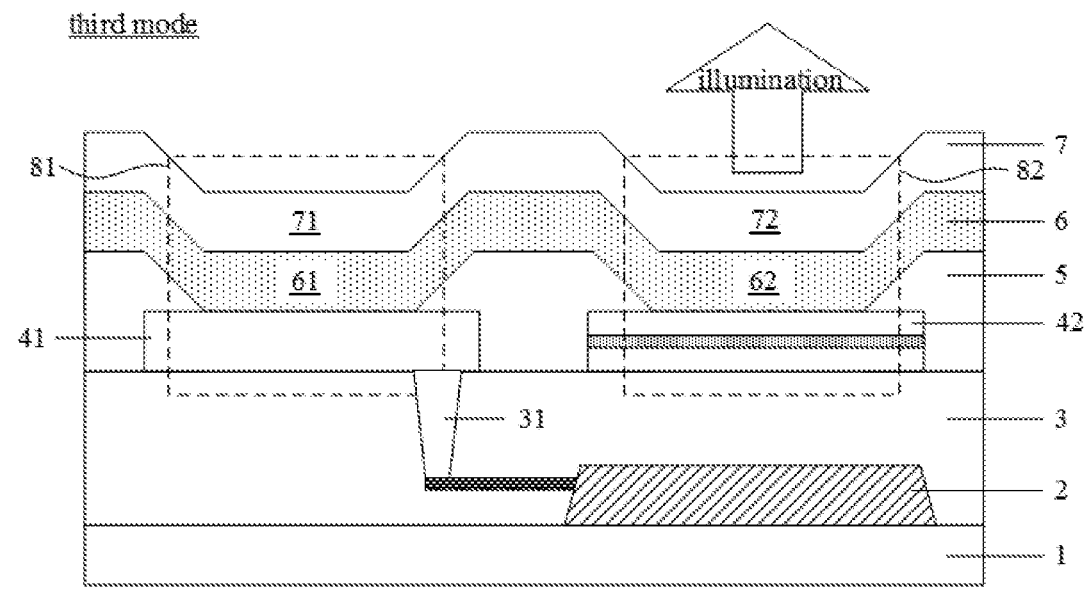
FIG. 13 is a schematic view of a third mode of a display panel in accordance with an embodiment of the present disclosure.

FIG. 13 is a schematic view of a third mode of a display panel in accordance with an embodiment of the present disclosure. As shown in FIG. 13, in the third mode, the first electrode 41 is connected to the source/drain electrode of the thin film transistor 2 through the via 31, with the first pixel 81 being used as a display pixel and the second pixel 82 being used as an illumination pixel. In the third mode, the first pixel 81 does not emit light, and the second pixel 82 emits light, thereby realizing single-side illumination. That is, the third mode can be referred as a single-side illumination mode.

Figure 14:
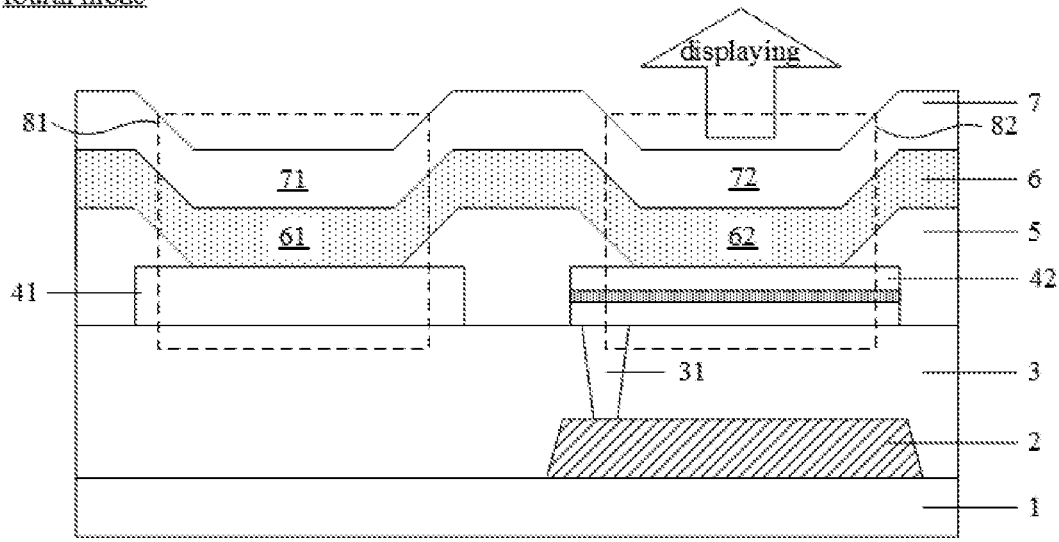
FIG. 14 is a schematic view of a fourth mode of a display panel in accordance with an embodiment of the present disclosure.

FIG. 14 is a schematic view of a fourth mode of a display panel in accordance with an embodiment of the present disclosure. As shown in FIG. 14, the second electrode 42 is connected to the source/drain electrode of the thin film transistor 2 through the via 31, with the first pixel 81 being used as an illumination pixel and the second pixel 82 being used as a display pixel. In the fourth mode, the first pixel 81 does not emit light, and the second pixel 82 emits light, thereby realizing single-side display. That is, the third mode can be referred as a single-side display mode.

Figure 15:
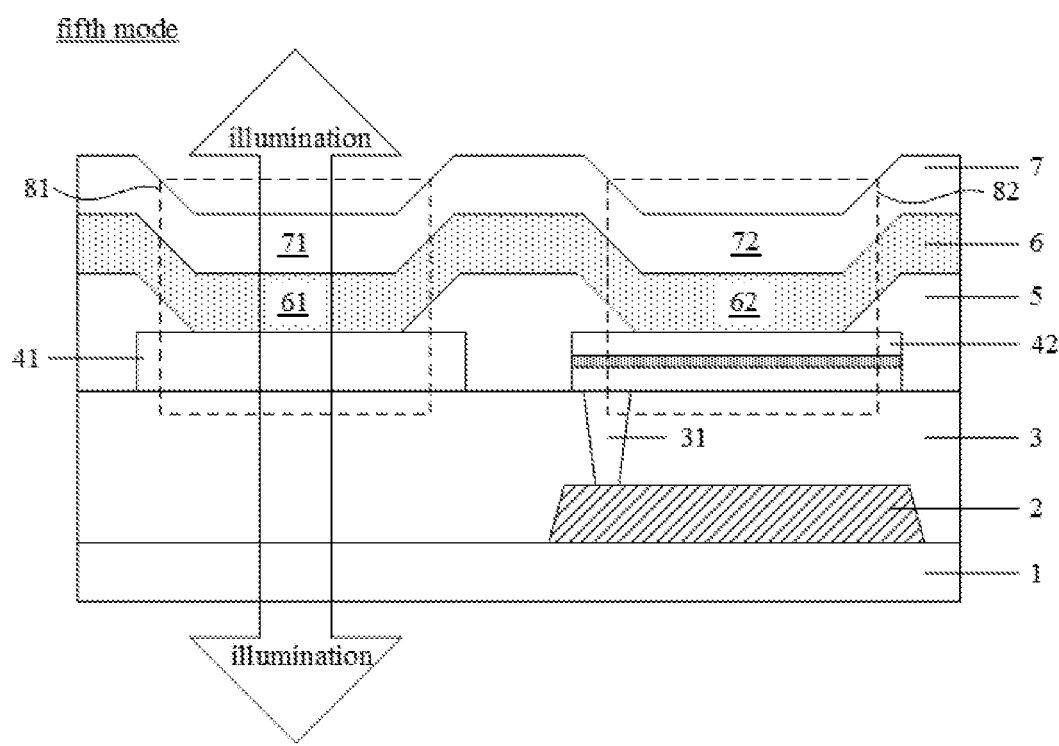
FIG. 15 is a schematic view of a fifth mode of a display panel in accordance with an embodiment of the present disclosure.

FIG. 15 is a schematic view of a fifth mode of a display panel in accordance with an embodiment of the present disclosure. As shown in FIG. 15, in the fifth mode, the second electrode 42 is connected to the source/drain electrode of the thin film transistor 2 through the via 31, with the first pixel 81 being used as an illumination pixel and the second pixel 82 being used as a display pixel. In the fifth mode, the first pixel 81 emits light, and the second pixel 82 does not emit light, thereby realizing double-side illumination. That is, the fifth mode can be referred as a double-side illumination mode.

In an embodiment of the present disclosure, there is also provided a display device including the above-described display panel, which can realize both display and illumination functions.

In an embodiment of the present disclosure, an anode is disposed between the thin film transistor of the display panel and the light emitting layer of the display panel to utilize the light emitting layer corresponding to the anode, thereby improving the aperture ratio of the display panel and enabling the display panel to realize both display and illumination functions.

The foregoing description of the embodiments has been provided for purpose of illustration and description. It is not intended to be exhaustive or to limit the disclosure. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are included within the scope of the disclosure.

What is claimed is:

1. A display panel comprising:
   a substrate;
   a thin film transistor on the substrate;
   an insulating layer covering the substrate and the thin film transistor;
   a first electrode and a second electrode on the insulating layer and electrically insulated with each other, wherein an orthographic projection of the first electrode on the substrate does not overlap with an orthographic projection of the thin film transistor on the substrate, and wherein an orthographic projection of the second electrode on the substrate overlaps with an orthographic projection of the thin film transistor on the substrate;
   a light emitting layer on the first electrode and the second electrode; and
   a third electrode and a fourth electrode on the light emitting layer, wherein an orthographic projection of the third electrode on the substrate overlaps with an orthographic projection of the first electrode on the substrate, and wherein an orthographic projection of the fourth electrode on the substrate overlaps with an orthographic projection of the second electrode on the substrate,
   wherein the first electrode, the third electrode, and a first portion of the light emitting layer between the first electrode and the third electrode constitute a first pixel, and wherein the second electrode, the fourth electrode, and a second portion of the light emitting layer between the second electrode and the fourth electrode constitute a second pixel.

2. The display panel according to claim 1, wherein the first electrode is connected to a source/drain electrode of the thin film transistor through a via penetrating the insulating layer, such that the first pixel is used as a display pixel and the second pixel is used as an illumination pixel.

3. The display panel according to claim 2, wherein the first electrode, the third electrode, and the fourth electrode are transparent electrodes, and wherein the second electrode is a non-transparent electrode.

4. The display panel according to claim 3, wherein the transparent electrode comprises a transparent conductive material and the non-transparent electrode comprises a metal.

5. The display panel according to claim 1, wherein the second electrode is connected to a source/drain electrode of the thin film transistor through a via penetrating the insulating layer, such that the first pixel is used as an illumination pixel and the second pixel is used as a display pixel.

6. The display panel according to claim 5, wherein the first electrode, the third electrode, and the fourth electrode are transparent electrodes, and wherein the second electrode is a non-transparent electrode.

7. The display panel according to claim 6, wherein the transparent electrode comprises a transparent conductive material and the non-transparent electrode comprises a metal.

8. The display panel according to claim 1, further comprising a pixel definition layer between the first electrode and the second electrode.

9. A displaying method using the display panel according to claim 8, the method comprising controlling the display panel using at least one of the following modes:
   a first mode in which the first pixel is a display pixel, the second pixel is an illumination pixel, the first pixel emits light, and the second pixel does not emit light;
   a second mode in which the first pixel is a display pixel, the second pixel is an illumination pixel, and the first pixel and the second pixel simultaneously emit light;
   a third mode in which the first pixel is a display pixel, the second pixel is an illumination pixel, the first pixel does not emit light, and the second pixel emits light;
   a fourth mode in which the first pixel is an illumination pixel, the second pixel is a display pixel, the first pixel does not emit light, and the second pixel emits light; and
   a fifth mode in which the first pixel is an illumination pixel, the second pixel is a display pixel, the first pixel emits light, and the second pixel does not emit light.

10. A display device comprising the display panel according to claim 1.

11. A displaying method using the display panel according to claim 1, the method comprising controlling the display panel using at least one of the following modes:
   a first mode in which the first pixel is a display pixel, the second pixel is an illumination pixel, the first pixel emits light, and the second pixel does not emit light;
   a second mode in which the first pixel is a display pixel, the second pixel is an illumination pixel, and the first pixel and the second pixel simultaneously emit light;
   a third mode in which the first pixel is a display pixel, the second pixel is an illumination pixel, the first pixel does not emit light, and the second pixel emits light;
   a fourth mode in which the first pixel is an illumination pixel, the second pixel is a display pixel, the first pixel does not emit light, and the second pixel emits light; and
   a fifth mode in which the first pixel is an illumination pixel, the second pixel is a display pixel, the first pixel emits light, and the second pixel does not emit light.

12. A method for manufacturing a display panel, the method comprising:
   forming a thin film transistor on a substrate;
   forming an insulating layer to cover the substrate and the thin film transistor;
   forming a first electrode and a second electrode electrically insulated with each other on the insulating layer, wherein an orthographic projection of the first electrode on the substrate does not overlap with an orthographic projection of the thin film transistor on the substrate, and wherein an orthographic projection of the second electrode on the substrate overlaps with an orthographic projection of the thin film transistor on the substrate;
   forming a light emitting layer on the first electrode and the second electrode; and
   forming a third electrode and a fourth electrode on the light emitting layer, wherein an orthographic projection of the third electrode on the substrate overlaps with an orthographic projection of the first electrode on the substrate, and wherein an orthographic projection of the fourth electrode on the substrate overlaps with an orthographic projection of the second electrode on the substrate,
wherein the first electrode, the third electrode, and a first portion of the light emitting layer between the first electrode and the third electrode constitute a first pixel, and wherein the second electrode, the fourth electrode, and a second portion of the light emitting layer between the second electrode and the fourth electrode constitute a second pixel.

13. The method according to claim 12, wherein forming the insulating layer further comprises patterning the insulating layer to form a via penetrating the insulating layer.

14. The method according to claim 13, wherein the first electrode is connected to a source/drain electrode of the thin film transistor through the via, such that the first pixel is used as a display pixel and the second pixel is used as an illumination pixel.

15. The method according to claim 14, wherein the first electrode, the third electrode, and the fourth electrode are transparent electrodes, and wherein the second electrode is a non-transparent electrode.

16. The method according to claim 15, wherein the transparent electrode comprises a transparent conductive material and the non-transparent electrode comprises a metal.

17. The method according to claim 13, wherein the second electrode is connected to a source/drain electrode of the thin film transistor through the via, such that the first pixel is used as an illumination pixel and the second pixel is used as a display pixel.

18. The method according to claim 17, wherein the first electrode, the third electrode, and the fourth electrode are transparent electrodes, and wherein the second electrode is a non-transparent electrode.

19. The method according to claim 18, wherein the transparent electrode comprises a transparent conductive material and the non-transparent electrode comprises a metal.

20. The method according to claim 12, further comprising forming a pixel definition layer between the first electrode and the second electrode prior to forming the light emitting layer.

* * * * *